(12) United States Patent
Nakayama

(10) Patent No.: US 6,788,545 B2
(45) Date of Patent: Sep. 7, 2004

(54) COMPOSITE ELECTRONIC COMPONENT AND METHOD OF PRODUCING SAME

(75) Inventor: Naoki Nakayama, Fukui-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 15 days.

(21) Appl. No.: 10/133,361

(22) Filed: Apr. 29, 2002

(65) Prior Publication Data

US 2002/0177360 A1 Nov. 28, 2002

(30) Foreign Application Priority Data

May 25, 2001 (JP) ........................................ 2001-157852

(51) Int. Cl.⁷ ................................................ H05K 5/06
(52) U.S. Cl. ..................... 361/752; 361/797; 361/800; 174/52.1; 29/832
(58) Field of Search ................................ 361/720, 760, 361/752, 797, 800, 796, 730; 29/832, 835; 174/52.1; 257/99

(56) References Cited

U.S. PATENT DOCUMENTS 6,079,099 A * 6/2000 Uchida et al. ................. 29/837
6,482,679 B1 * 11/2002 Kato et al. .................... 438/121

* cited by examiner

Primary Examiner—David Martin
Assistant Examiner—Hung S. Bui
(74) Attorney, Agent, or Firm—Keating & Bennett, LLP

(57) ABSTRACT

A high frequency composite electronic component includes a laminate and a metallic case. The laminate is produced by laminating plural ceramic green sheets and includes circuit elements such as capacitors or other electronic elements therein. A plurality of grounding external electrodes disposed on a side surface of the laminate are connected to a terminal of the metallic case via soldering. The external electrodes are formed by forming a plurality of via-holes having conductive members applied therein in ceramic green sheets as mother sheets along predetermined cut lines provided thereon, and cutting a laminate of the mother sheets along the cut lines to cut the via-holes and expose the conductive members applied in the via-holes onto the side surface of the laminate.

13 Claims, 7 Drawing Sheets

Fig. 3
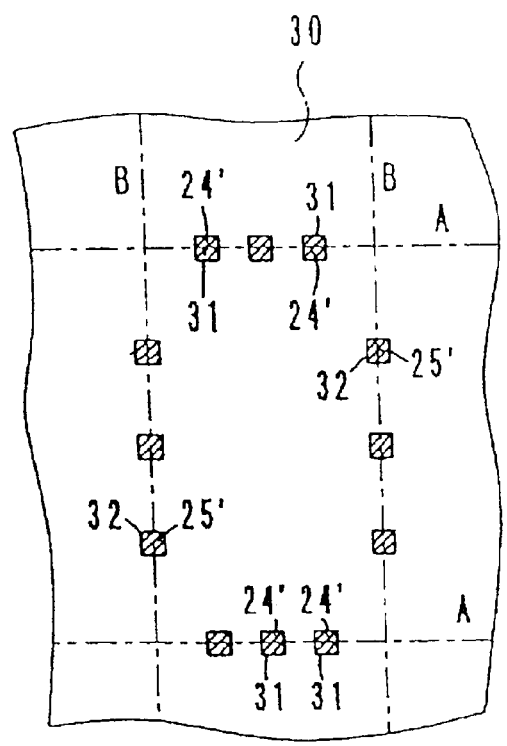
Fig. 4A
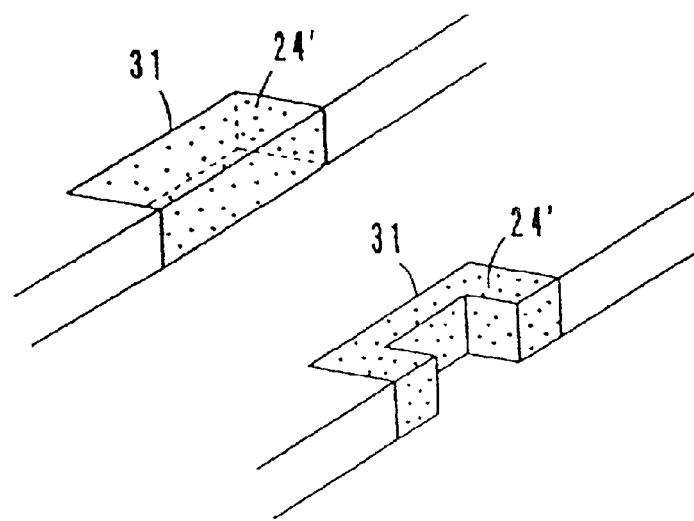
Fig. 4B

COMPOSITE ELECTRONIC COMPONENT AND METHOD OF PRODUCING SAME

BACKGROUND OF THE INVENTION

1. Field of the Invention

The present invention relates to a composite electronic component including circuit elements such as a capacitor, an inductor, and other elements, and a method of producing such a composite electronic component.

2. Description of the Related Art

FIG. 11 shows a conventional high frequency composite electronic component of the related art, in which an electronic component 9 is mounted onto a laminate type substrate 1 including circuit elements such as a capacitor and an inductor, and a metallic case 7 is integrated with them. A grounding external electrode 4 and input-output external electrodes 5 are disposed on side surfaces 2 and 3 of the laminate type substrate 1 (also on the opposite side surfaces). A terminal 8 of the metallic case 7 is soldered to the grounding external electrode 4.

As described in Japanese Unexamined Patent Application Publication No. 6-96992 by the applicant of the present invention, as shown in FIG. 12, via-holes 11 and 12 filled with conductive members (conductive paste) 4' and 5' are formed along cut lines A and B in a mother ceramic green sheet 10 (hereinafter, referred to as a via-hole filling process). A mother laminate is cut along the cut lines A and B, whereby the conductive members 4' and 5' are exposed at the side surfaces 2 and 3.

However, the via-holes 11 have a large, elongated rectangular cross-section, respectively. Accordingly, the conductive paste tends to be insufficiently filled into the via-holes 11. Thus, there is a danger in that the conductive paste is released, deficient grounding external electrodes 4 are formed by firing, and the reliability of electrical connection of the external electrode 4 to the internal circuit elements and the terminal 8 of the metallic case becomes insufficient.

As countermeasures against the above-described problems, an attempt was made to increase the number of times which the conductive paste is filled. This caused problems in that the conductive paste was excessively filled, and cracks were formed in the external electrode 4, due to the difference between the firing shrinkage ratios of the conductive paste and a ceramic sheet.

Furthermore, the via-holes 11 having an elongated rectangular cross-section have problems in that inevitably, the contact area between the external electrode 4 and the ceramic raw laminate is small, and the bonding strength is low.

SUMMARY OF THE INVENTION

In order to overcome the problems described above, preferred embodiments of the present invention provide a composite electronic component which is provided with external electrodes having a high reliability of electrical connection and a excellent bonding strength for bonding to a ceramic laminate, and a method of producing such a novel composite electronic composite.

According to a preferred embodiment of the present invention, a composite electronic component including a laminate including a plurality of insulation sheets laminated with internal circuit elements being interposed between the insulation sheets, external electrodes electrically connected to the internal circuit elements and disposed on side surfaces of the laminate, and a metallic case arranged to cover at least a portion of the upper surface of the laminate and having terminals electrically connected to the external electrodes, the external electrodes being arranged such that a plurality of external electrodes are provided on at least one side surface of the laminate and electrically connected to the same terminal of the metallic case.

In the composite electronic component of preferred embodiments of the present invention, preferably, the external electrodes are made of the conductive material used to form the conductive members disposed in the plurality of the via-holes formed in the insulation sheets. The cross-section of the via-holes may preferably be substantially quadrangular, substantially circular, or substantially elliptic, instead of being elongated-rectangular as in the related art. By providing appropriate amounts of the conductive members, release of the conductive members from the via-holes and formation of cracks can be prevented, and thus, the electrical connection has greatly improved reliability. Moreover, the contact area between the external electrodes and the raw laminate is increased, and the bonding strength of the external electrodes is greatly improved.

The plurality of the external electrodes may be arranged substantially parallel to each other in the lamination direction of the laminate, and may be electrically connected to each other via conductive members which are arranged to extend substantially perpendicularly to the lamination direction of the laminate. Thus, the surface area of the external electrodes is increased, and the contact area thereof to the terminal of the metallic case is also increased. The connection reliability is thereby greatly improved. The conductive members may be positioned so as to contact with the mounting surface of the laminate. Accordingly, the reliability of connection between the external electrodes and the terminal of the metallic case is greatly improved, and moreover, the external electrodes and a land of a packaging substrate can be securely soldered.

According to another preferred embodiment of the present invention, a method of producing a composite electronic component includes the steps of forming via-holes in mother sheets along cut lines provided on the mother sheets, the via-holes having conductive paste for electrical connection thereof to internal circuit elements applied therein, laminating a plurality of the mother sheets with internal circuit elements being interposed between mother sheets, cutting the laminate of the mother sheets along the cut lines to expose a plurality of solidified paste members applied into the via-holes onto at least one side surface of the laminate whereby external electrodes are formed, and connecting the plurality of the external electrodes on the same side surface to the same terminal of a metallic case which covers at least a portion of the upper surface of the laminate.

According to the method of producing the composite electronic component of a preferred embodiment of the present invention, the external electrodes are preferably formed using the conductive paste applied in the plurality of the via-holes. The cross-section of the via-holes may be substantially quadrangular, substantially circular, or substantially elliptic, instead of being elongated-rectangular as in the related art. By providing appropriate amounts of the conductive members, release of the conductive members from the via-holes and formation of cracks, which may occur at firing, are reliably prevented, and thus, the electrical connection has a greatly improved reliability. Moreover, the contact area between the external electrodes and the laminate is significantly increased, and the bonding strength of the external electrodes is greatly improved.

Other features, elements, characteristics and advantages of the present invention will become more apparent from the following detailed description of preferred embodiments thereof with reference to the attached drawings.

BRIEF DESCRIPTION OF THE DRAWINGS

FIG. 3 is a plan view of a mother green sheet for use in production of the laminate constituting the composite electronic component of FIG. 1;

FIGS. 4A and 4B are perspective views showing first via-holes of the laminate constituting the composite electronic component of FIG. 1;

DETAILED DESCRIPTION OF PREFERRED EMBODIMENTS

Hereinafter, preferred embodiments of the composite electronic component and the method of producing the same of the present invention will be described with reference to the accompanying drawings.

Figure 1:
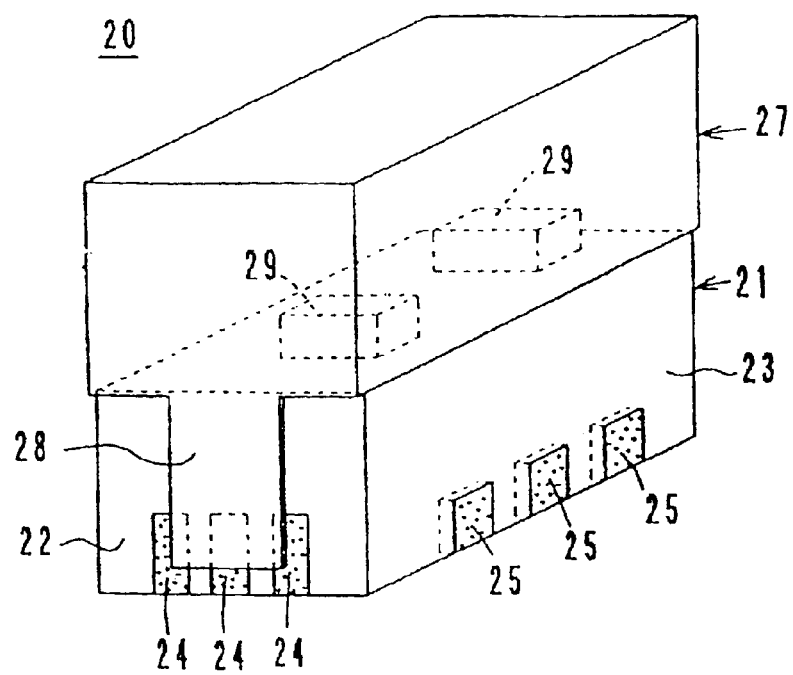
FIG. 1 is a perspective view of a composite electronic component according to a first preferred embodiment of the present invention.

As shown in FIG. 1, a high frequency composite electronic component 20, which is a first preferred embodiment of the present invention, includes a laminate 21 having a capacitor, an inductor, a filter, a delay line, and other suitable electronic elements, chip electronic elements 29 such as capacitors, inductors, diodes, SAW filters, and other suitable elements, which are mounted onto the upper surface of the laminate 21, and a metallic case 27 integrated with the laminate 21.

Figure 13:
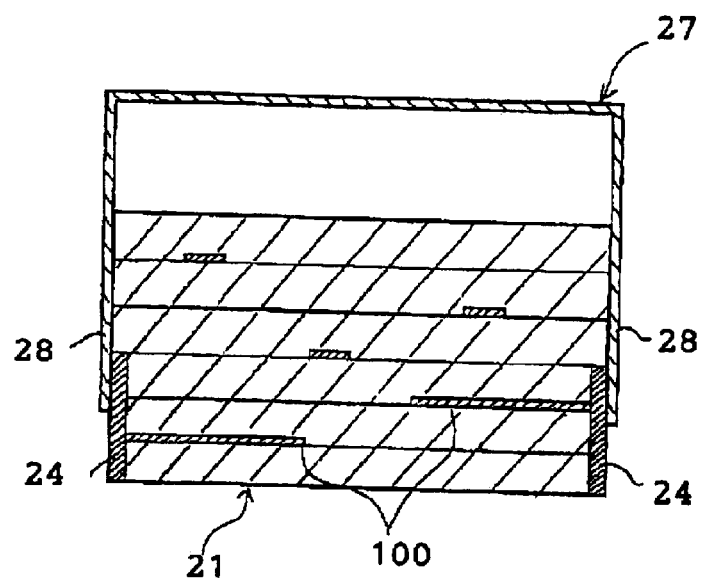
FIG. 13 is a sectional view of the composite electronic component.

The laminate 21 is preferably formed by laminating a plurality of ceramic green sheets, press-bonding, cutting, and firing. A predetermined green sheet is provided with internal circuit elements 100 such as a capacitor, an inductor, a filter, a delay line, and other suitable elements as shown in FIG. 13, which are formed by patterning using conductive and resistant materials. Grounding external electrodes 24 and input-output external electrodes 25 are formed on side surfaces 22 and 23 of the laminate 21 (also, on the side surfaces opposite to the side surfaces 22 and 23), respectively.

The three grounding external electrodes 24 exposed at the side surface 22 are electrically connected to the internal circuit elements and, moreover, electrically connected to a terminal 28 of a metallic case 27 by soldering. The terminal 28 preferably has a substantially flat rectangular shape, and is extended in the lamination direction of the laminate 21. Also, the input-output external electrodes 25 are electrically connected to the internal circuit elements. These external electrodes 24 and 25 are connected to lands of a packaging substrate (not shown), for example, by re-flow soldering.

Figure 2:
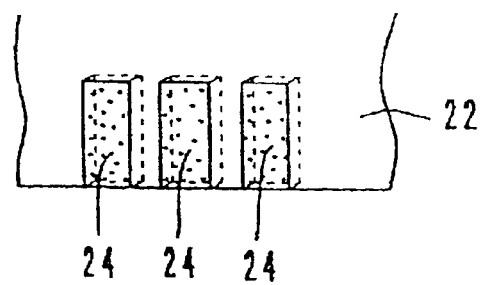
FIG. 2 is an elevational view showing an essential portion of a laminate constituting the composite electronic component of FIG. 1.

The three external electrodes 24 preferably have a width of about 0.3 mm and a pitch of about 1 mm, for example. In FIGS. 1 and 2, for easy understanding, the external electrodes 24 and 25 are relatively enlarged to be more clearly viewable. This is true of those in second and third preferred embodiments which are described below.

Hereinafter, a method of forming the external electrodes 24 and 25 will be described. First, as shown in FIG. 3, a desired number of via-holes 31 and 32 are formed in mother ceramic green sheets 30 so as to be positioned along cut lines A and B. Conductive members (conductive paste) 24' and 25' preferably containing copper or other suitable material as a major component are filled into the via-holes 31 and 32. Patterns for circuit elements to be included in the laminate are formed simultaneously with the step of filling the conductive members into the via-holes. A required number of the mother ceramic green sheets 30 and several types of mother ceramic green sheets having other patterns printed thereon are laminated in a predetermined order and pressed. Thereafter, the pressed laminate is cut along the cut lines A and B preferably via a dicing saw or other suitable cutting element, whereby the solidified paste filled in the via-holes is exposed on the respective laminates. Thereafter, the paste is fired together with the laminate. In some cased, the cutting is carried out after the laminate is fired.

By the above-described processes, the laminate 21 having the conductive members 24' and 25' filled in the via-holes 31 and 32 and exposed on the side surfaces 22 and 23 as the external electrodes 24 and 25 is obtained. Thereafter, as shown in FIG. 1, chip circuit elements 29 are connected to a wiring pattern formed on the upper surface of the laminate preferably via soldering. Moreover, a metallic case is arranged to cover the chip circuit elements 29. Each terminal 28 provided for the metallic case is electrically connected commonly to the plural grounding external electrodes formed on the same side surface of the laminate. Thereby, the composite electronic component of a preferred embodiment of the present invention is obtained.

Figure 5A:
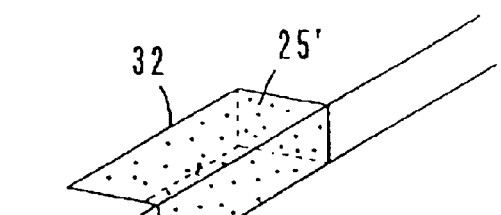
FIGS. 5A and 5B are perspective views showing second via-holes of the laminate constituting the composite electronic component of FIG. 1.
Figure 5B:
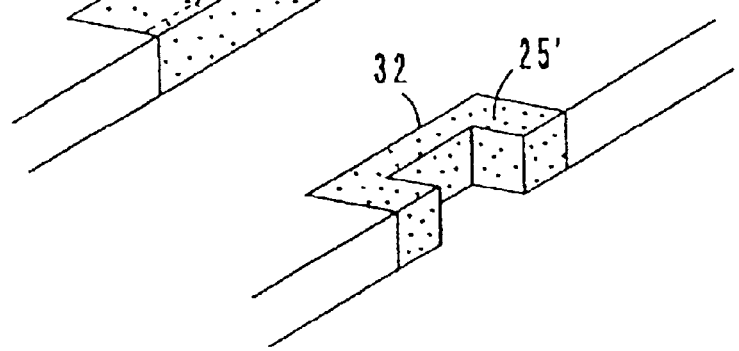

As shown in FIGS. 4A and 5B, the conductive members 24' and 25' may be completely filled into the via-holes 31 and 32, or may be filled in such a manner as to adhere to the inner walls of the via-holes 31 and 32, forming cavities in the centers thereof, respectively. The via-holes 31 and 32 may be substantially circular or substantially rectangular or may be substantially elliptical in the cross-sections thereof. The shape and size of the via-holes 31 and 32 are not particularly limited.

The grounding external electrodes 24 are preferably made of the conductive members 24' provided for the relatively small via-holes 31 in the laminate 21. Thus, an adequate amount of the conductive members 24' can be provided. Accordingly, release of the external electrodes 24 from the via-holes is reliably prevented, and formation of cracks in the external electrodes 24 is eliminated. Thus, the reliability of electrical connection is greatly improved. The total contact area of the external electrodes 24 with the raw laminate is large, which greatly improves the bonding strength of the external electrodes 24 to the raw laminate.

Figure 6:
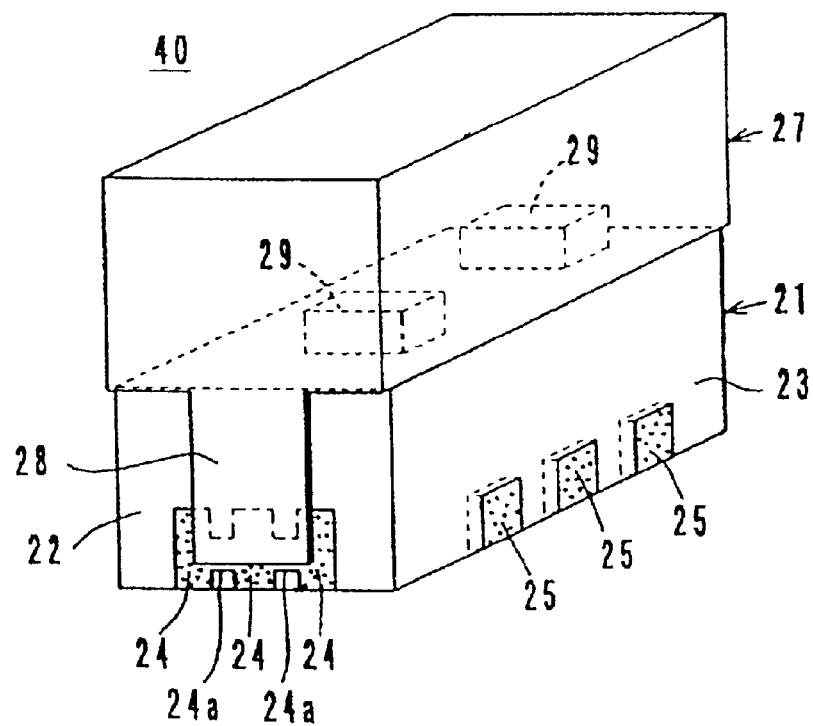
FIG. 6 is a perspective view of a composite electronic component according to a second preferred embodiment of the present invention.
Figure 7:
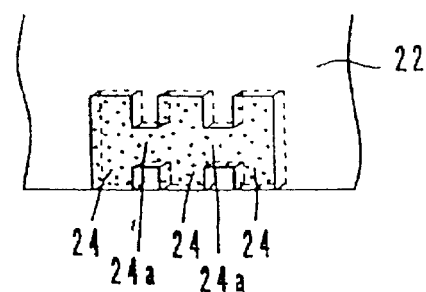
FIG. 7 is an elevational view showing an essential portion of a laminate constituting the composite electronic component of FIG. 6.

A high frequency composite electronic component 40 according to a second preferred embodiment of the present invention preferably has essentially the same configuration as that of the high frequency composite electronic component 20 of the first preferred embodiment, as shown in FIG. 6. In FIG. 6, elements that are similar to those of the first preferred embodiment are designated by the same reference numerals, and the repeated description is omitted.

Figure 8A:
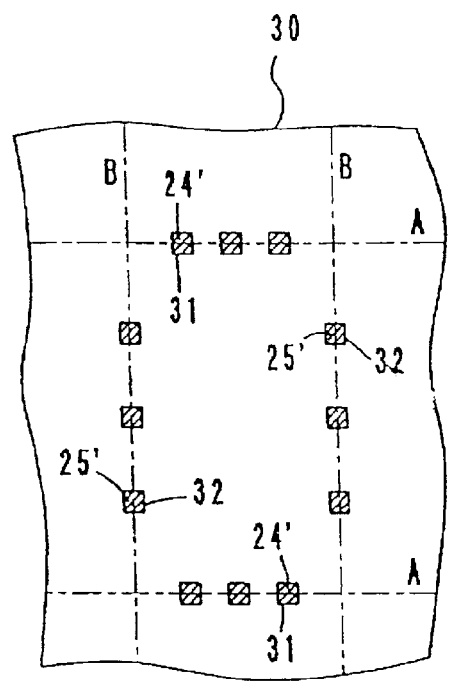
FIG. 8 is a plan view of a mother green sheet for use in production of the laminate constituting the composite electronic component of FIG. 6.
Figure 8B:
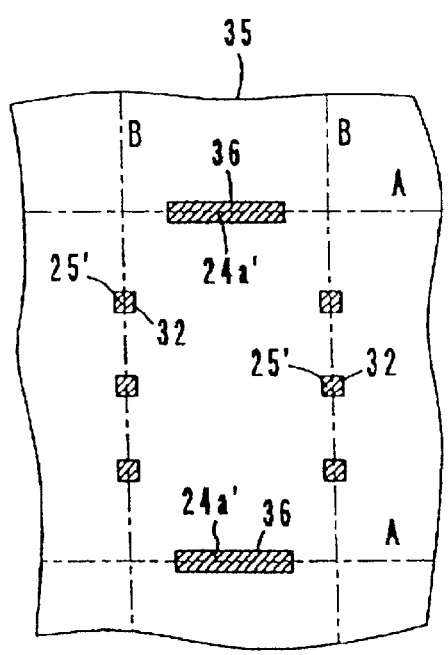

The high frequency composite electronic component 40 is different from the electronic component of the first preferred embodiment in that the middle portions in the vertical direction of the external electrodes 24 on the same side surface are connected to each other preferably via conductive members 24a. To form the external electrodes 24 having the middle portions connected to the conductive members 24a, mother ceramic green sheets 30 (the same sheets as those of FIG. 3) shown in FIG. 8A and mother ceramic green sheets 35 with via-holes 36 having elongated-rectangular cross-sections and provided with conductive members (conductive paste) 24a' as shown in FIG. 8B are laminated in combination to form a laminate 2.

According to the second preferred embodiment, the external electrodes 24 are not separated from each other, ranging from the mounting surface (the bottom of the laminate 21) to a height of about 100 μm in the lamination direction, and the middle portions ranging from about 100 μm to about 150 μm in height of the external electrodes 24 are connected via the conductive members 24a, and the portions ranging from about 150 μm to about 250 μm in height are separated. The respective grounding external electrodes 24 have a width of about 0.3 mm and a pitch of about 1 mm similarly to those of the first embodiment. It should be noted that the numerical values are described here by way of an example and are not limiting of the present invention.

The high frequency composite electronic component 40 of the second preferred embodiment has the same operation and effects as those of the first preferred embodiment. In addition, the soldering strength of the metallic case 27 to the terminals 28 is increased since the surface area of the external electrodes 24 is increased due to the conductive members 24a. Thus, the connection reliability is greatly improved.

Referring to a method of forming the conductive members 24a, conductive paste may be applied by coating or printing to the side surface of the laminate having the external electrodes 24 formed thereon, in addition to the above-described method of filling the conductive members into the via-holes. Thus, the plural external electrodes 24 can be electrically connected.

Figure 9:
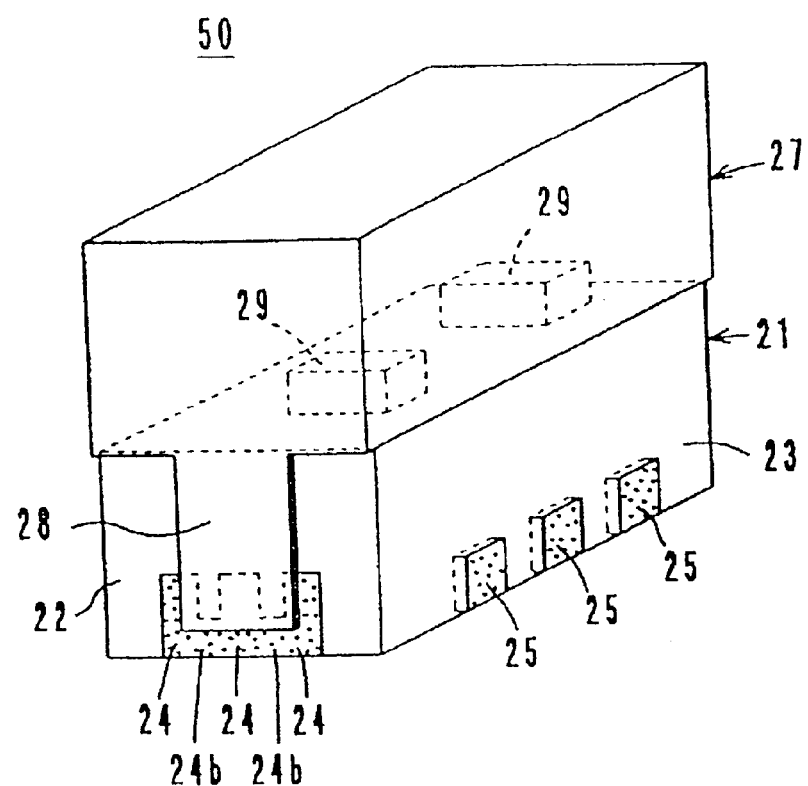
FIG. 9 is a perspective view of a composite electronic component according to a third preferred embodiment of the present invention.
Figure 10:
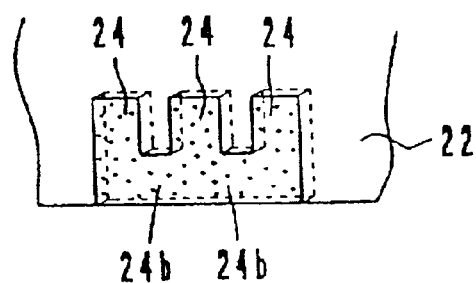
FIG. 10 is an elevational view showing an essential portion of a laminate constituting the composite electronic component of FIG. 9.
Figure 11:
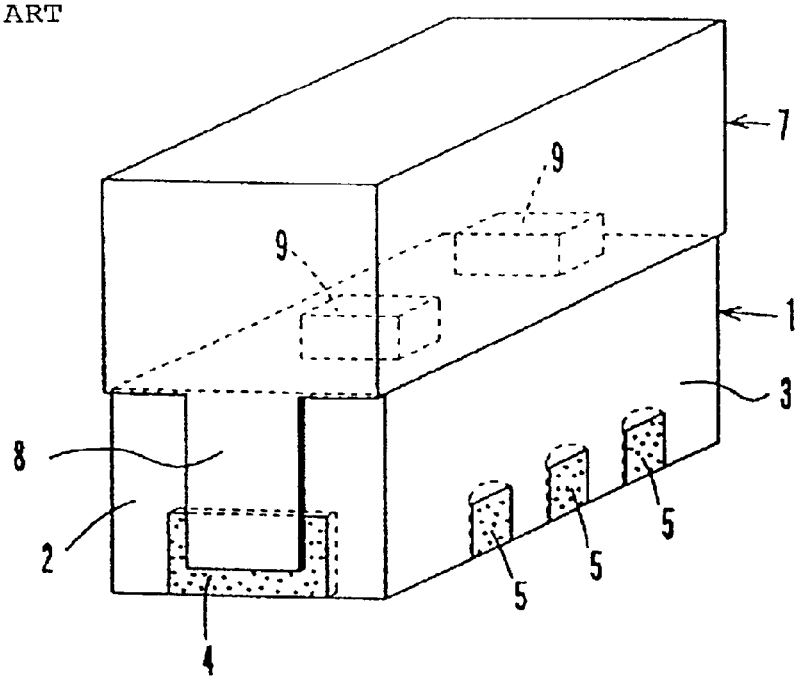
FIG. 11 is a perspective view of a composite electronic component of the related art.
Figure 12:
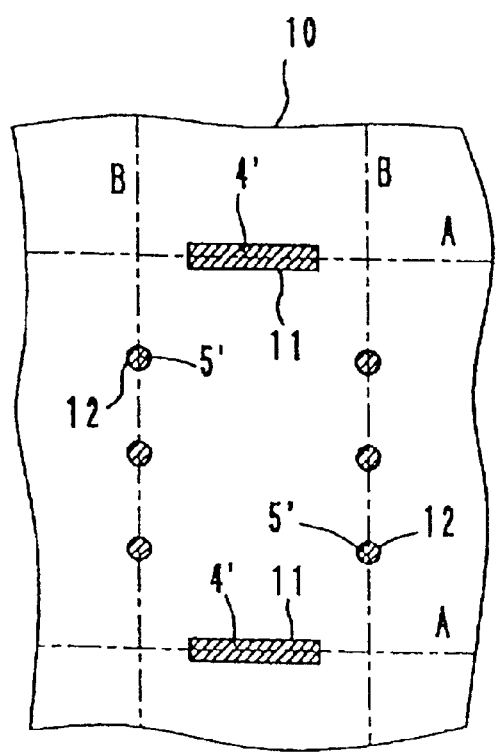
FIG. 12 is a plan view of a mother green sheet for use in production of the laminate constituting the composite electronic component of the related art shown in FIG. 11.

A high frequency composite electronic component 50 preferably has essentially the same configuration as that of the high frequency composite electronic part 20 of the first preferred embodiment, as shown in FIG. 9. In FIG. 9, elements that are similar to those of the first preferred embodiment are designated by the same reference numerals, and the repeated description is omitted.

The high frequency composite electronic component 50 is different from the electronic component of the first preferred embodiment in that the lower portions in the vertical direction of the external electrodes 24 on the same side surface are connected to each other preferably via conductive members 24b. The conductive members 24b are in contact with the lower end of the side surface 22. To form the external electrodes 24 connected to each other via the conductive members 24b, the mother ceramic green sheets 30 and 35 shown in FIGS. 8A and 8B are used in combination.

Referring to a method of forming the conductive members 24b, conductive paste may be applied onto the side surface of the laminate having the grounding external electrodes 24 formed thereon by coating, printing, or other suitable process, in addition to the via-hole filling method, as previously described.

According to the third preferred embodiment, the grounding external electrodes 24 are connected to each other ranging from the mounting surface (the bottom of the laminate 21) to a height of about 50 μm, separated from each other, ranging from the height of about 50 μm to that of about 250 μm. The width of the respective external electrodes 24 is about 0.3 mm, and the pitch is about 1 mm, as with those in the first preferred embodiment. Needless to say, the numerical values are described here by way of an example only and are not limiting of the present invention.

The high frequency composite electronic component 50 of the third preferred embodiment has the same operation and effects as those of the first and second preferred embodiments. In addition, the grounding external electrodes 24 and lands of a packaging substrate (not shown) can be securely soldered to each other, since the conductive members 24b are formed so as to be in contact with the mounting surface (bottom) of the laminate 21.

The composite electronic component and the method of producing the same of the present invention are not limited onto the above-described preferred embodiments, and different preferred embodiments of the present invention may be made without departing from the spirit and the scope thereof.

Especially, any type of circuit elements may be included in the laminate. Moreover, the external electrodes connected to the terminals of the metallic case do not need to be used for grounding.

In the above-described preferred embodiments, the upper surface of the laminate 21 is preferably entirely covered with the metallic case 27. The metallic case 27 is required only to have such a size that it can cover the electronic elements 29 provided on the upper surface of the laminate 21. A portion of the upper surface of the laminate 21 may be exposed from the metallic case 27.

The grounding external electrodes 24 may be provided not only on the side surfaces 22 (the side surfaces in the longitudinal direction) but also on the side surfaces 23. Moreover, the shapes of the via-holes 31 and 32 may be different from each other.

As easily seen in the above-description, according to preferred embodiments of the present invention, the external electrodes which are connected to the same terminal of the metallic case are preferably formed by via-hole filling technique in which appropriate amounts of the conductive members can be provided. Thus, release of the electrodes and formation of cracks are eliminated. Thus, the composite electronic component having a high reliability of connection between the external electrodes and the internal circuit elements or the terminal of the metallic case can be provided.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A composite electronic component comprising:

a laminate including a plurality of insulation sheets laminated with at least one internal circuit element being interposed between at least two of the plurality of insulation sheets;

external electrodes electrically connected to the at least one internal circuit element and disposed on side surfaces of the laminate; and a metallic case arranged so as to cover at least a portion of the upper surface of the laminate and having a terminal electrically connected to the external electrodes;

wherein the external electrodes are arranged such that a plurality of the external electrodes are provided on a single side surface of the laminate and electrically connected to the terminal of the metallic case.

2. A composite electronic component according to claim 1, wherein the external electrodes include conductive members applied in via-holes on the side surfaces of the laminate.

3. A composite electronic component according to claim 1, wherein the plurality of the external electrodes are arranged to extend substantially parallel to each other in the lamination direction of the laminate.

4. A composite electronic component according to claim 3, wherein the plurality of the external electrodes are electrically connected to each other via conductive members which are arranged to extend substantially perpendicularly to the lamination direction of the laminate.

5. A composite electronic component according to claim 4, wherein the conductive members which are arranged to extend substantially perpendicularly to the lamination direction of the laminate are positioned so as to be in contact with the mounting surface of the laminate.

6. A composite electronic component according to claim 1, wherein an electronic component that is covered by the metallic case is mounted on the upper surface of the laminate.

7. A composite electronic component according to claim 1, wherein the plurality of the external electrodes are ground electrodes and are electrically connected in common to the same terminal of the metallic case.

8. A composite electronic component according to claim 1, wherein a plurality of internal circuit elements are disposed in the laminate and between the insulation sheets.

9. A composite electronic component according to claim 1, wherein the at least one internal circuit element includes at least one of a capacitor, an inductor, a filter, a delay line, and chip electronic elements.

10. A composite electronic component according to claim 2, wherein the via holes have one of a substantially circular cross-sectional shape, a substantially rectangular cross-sectional shape, and a substantially elliptical cross-sectional shape.

11. A composite electronic component according to claim 2, wherein the conductive members are arranged to completely fill the via holes.

12. A composite electronic component according to claim 2, wherein the conductive members are arranged to partially fill the via holes.

13. A composite electronic component according to claim 2, wherein the plurality of external electrodes are ground electrodes and are made of the same material as the conductive members are made of.

* * * * *